United States Patent
Igari

(10) Patent No.: US 10,150,302 B2
(45) Date of Patent: Dec. 11, 2018

(54) LIGHT EXPOSURE DEVICE, IMAGE FORMING APPARATUS, LIGHT RECEPTION DEVICE, AND IMAGE READING APPARATUS

(71) Applicant: Oki Data Corporation, Minato-ku, Tokyo (JP)

(72) Inventor: Tomoki Igari, Tokyo (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 15/709,735

(22) Filed: Sep. 20, 2017

(65) Prior Publication Data

US 2018/0086103 A1 Mar. 29, 2018

(30) Foreign Application Priority Data

Sep. 29, 2016 (JP) ................. 2016-190867

(51) Int. Cl.
| | |
|---|---|
| *B41J 2/45* | (2006.01) |
| *G03G 15/043* | (2006.01) |
| *H01L 33/60* | (2010.01) |
| *G03G 15/04* | (2006.01) |
| *H04N 1/00* | (2006.01) |
| *H01L 27/15* | (2006.01) |

(52) U.S. Cl.
CPC ........... *B41J 2/451* (2013.01); *G03G 15/043* (2013.01); *G03G 15/04054* (2013.01); *H01L 33/60* (2013.01); *H04N 1/00* (2013.01); *G03G 2215/0409* (2013.01); *H01L 27/153* (2013.01)

(58) Field of Classification Search
CPC . B41J 2/451; G03G 15/04054; G03G 15/043; G03G 2215/0409; H01L 33/60; H01L 27/153; H04N 1/00
See application file for complete search history.

(56) References Cited

U.S. PATENT DOCUMENTS 9,062,846 B2 * 6/2015 Hayashi ................. F21V 29/00

FOREIGN PATENT DOCUMENTS

JP 2009073041 A 4/2009

* cited by examiner

*Primary Examiner* — Kyoung Lee
(74) *Attorney, Agent, or Firm* — Panitch Schwarze Belisario & Nadel LLP

(57) ABSTRACT

An LED head includes a base material having one or more wiring pattern formation surfaces and one or more metal wiring patterns formed on the one or more wiring pattern formation surfaces. When the occupancy ratio of the one or more metal wiring patterns in a first region of a substrate is A, and the occupancy ratio of the one or more metal wiring patterns in a second region of the substrate is B, the LED head satisfies $0.75 \leq A/B \leq 1$ or $0.75 \leq B/A \leq 1$.

15 Claims, 12 Drawing Sheets

| RATIO R | AMOUNT OF WARPAGE |
|---|---|
| $0.9 \leqq R \leqq 1$ | 10 μm |
| $0.75 \leqq R \leqq 1$ | 30 μm |
| $0.70 \leqq R \leqq 1$ | 40 μm |

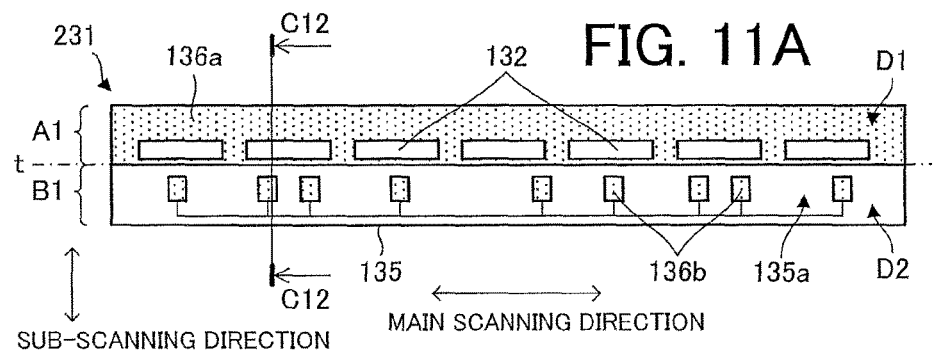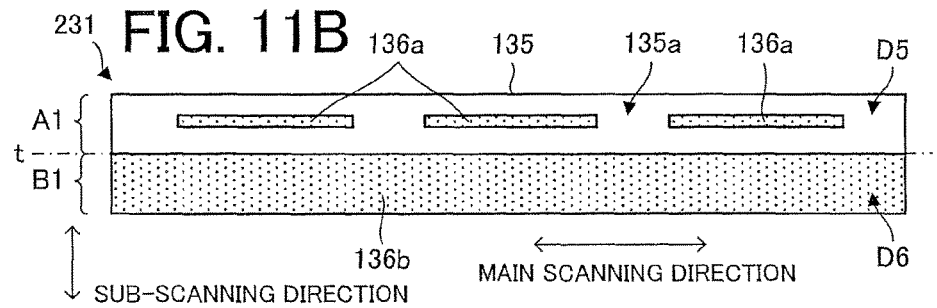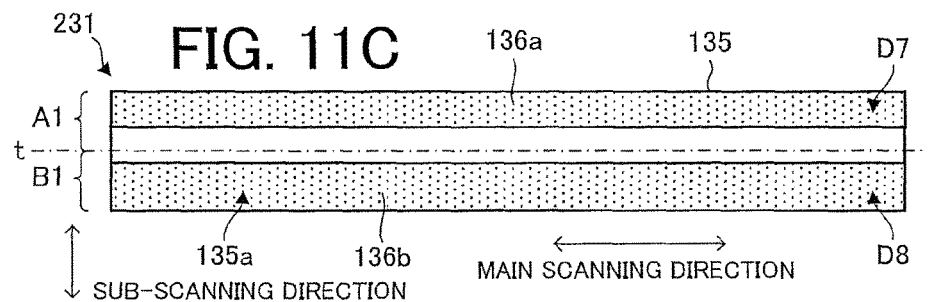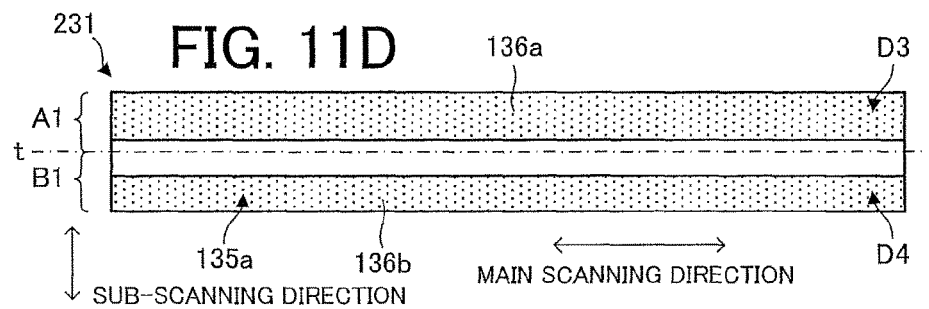

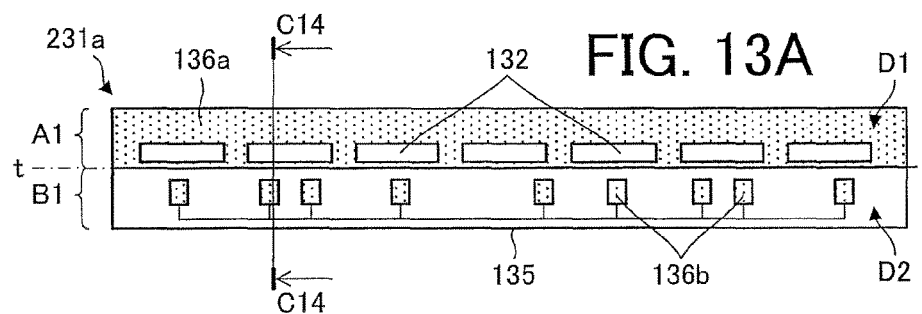
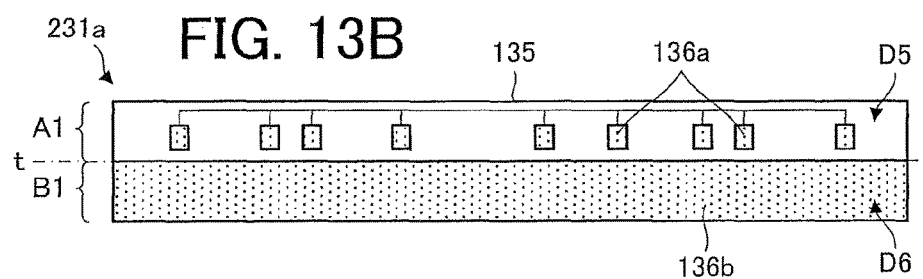
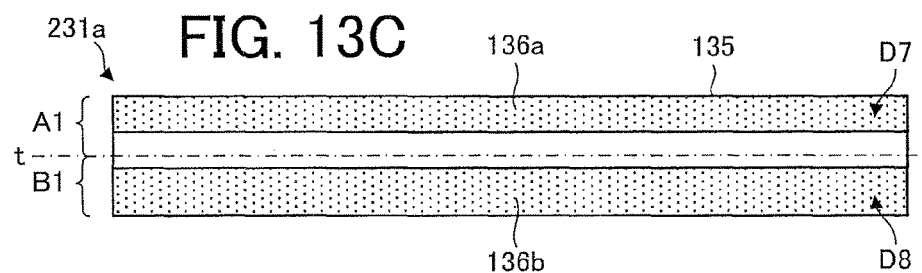
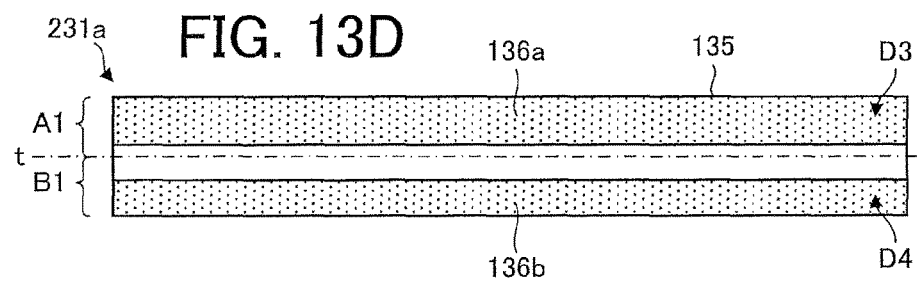

LIGHT EXPOSURE DEVICE, IMAGE FORMING APPARATUS, LIGHT RECEPTION DEVICE, AND IMAGE READING APPARATUS

BACKGROUND OF THE INVENTION

1. Field of the Invention

The present invention relates to a light exposure device that includes a substrate provided with a semiconductor element.

2. Description of the Related Art

In general, a light exposure device including a substrate provided with a light emitting element (for example, a light emitting diode) as a semiconductor element is used in an image forming apparatus, such as a printer, a copy machine, a facsimile machine, and a multi-function machine, which employs an electrophotographic method. For example, the light emitting element is fixed on a base material of the substrate, and a metal wiring pattern (for example, printed wiring, wire bonding pad, etc. on the substrate) electrically connected with the light emitting element is formed on the base material. This light exposure device irradiates light on a surface of a photoreceptor drum in the image forming apparatus and forms an electrostatic latent image, by causing the light emitting element to emit light in accordance with image data (for example, refer to patent reference 1: Japanese Patent Application Publication No. 2009-73041).

SUMMARY OF THE INVENTION

The temperature of the substrate is increased by the light emission of the light emitting element in the above light exposure device, and the base material of the substrate and the metal wiring pattern formed on the base material expands in some cases. In these cases, the substrate tends to warp, depending on wiring pattern structure of the metal wiring pattern on the base material. For example, when the wiring pattern structure (for example, the area of the metal wiring pattern) is asymmetric in a sub-scanning direction of the light exposure device, there is a problem that the substrate tends to warp in the sub-scanning direction due to a rise of the substrate temperature. When the substrate warps in the sub-scanning direction, the position of the light irradiated on the surface of the photoreceptor drum shifts, and the quality of printing by the image forming apparatus decreases.

In order to solve the above problem, a purpose of the present invention is providing a light exposure device that can reduce the warpage of the substrate even when the temperature of the substrate of the light exposure device rises.

Means for Solving the Problem

A light exposure device includes a substrate being longer in a first direction and a plurality of light emitting elements fixed on the substrate. The substrate includes a base material having one or more wiring pattern formation surfaces and one or more metal wiring patterns formed on the one or more wiring pattern formation surfaces. The substrate is divided into two regions by a boundary line which is a center line of the wiring pattern formation surface in a second direction orthogonal to the first direction. One region of the two regions is a first region, and the other region of the two regions is a second region. The light exposure device satisfies $0.75 \leq A/B \leq 1$ or $0.75 \leq B/A \leq 1$, where A is a ratio of a sum of one or more areas of the one or more metal wiring patterns in the first region to a sum of one or more areas of the one or more wiring pattern formation surfaces in the first region, and B is a ratio of a sum of one or more areas of the one or more metal wiring patterns in the second region to a sum of one or more areas of the one or more wiring pattern formation surfaces in the second region.

The present invention can provide a light exposure device that can reduce the warpage of the substrate even when the temperature of the substrate of the light exposure device rises.

BRIEF DESCRIPTION OF THE DRAWINGS

FIGS. 11A to 11D are plan views schematically illustrating a structure of a substrate of an LED head as a light exposure device according to a second embodiment of the present invention.

FIGS. 13A to 13D are plan views schematically illustrating a structure of a substrate of an LED head as a light exposure device according to a variant example of the second embodiment.

MODE FOR CARRYING OUT THE INVENTION

First Embodiment

<Configuration of Image Forming Apparatus 1>

Figure 1:
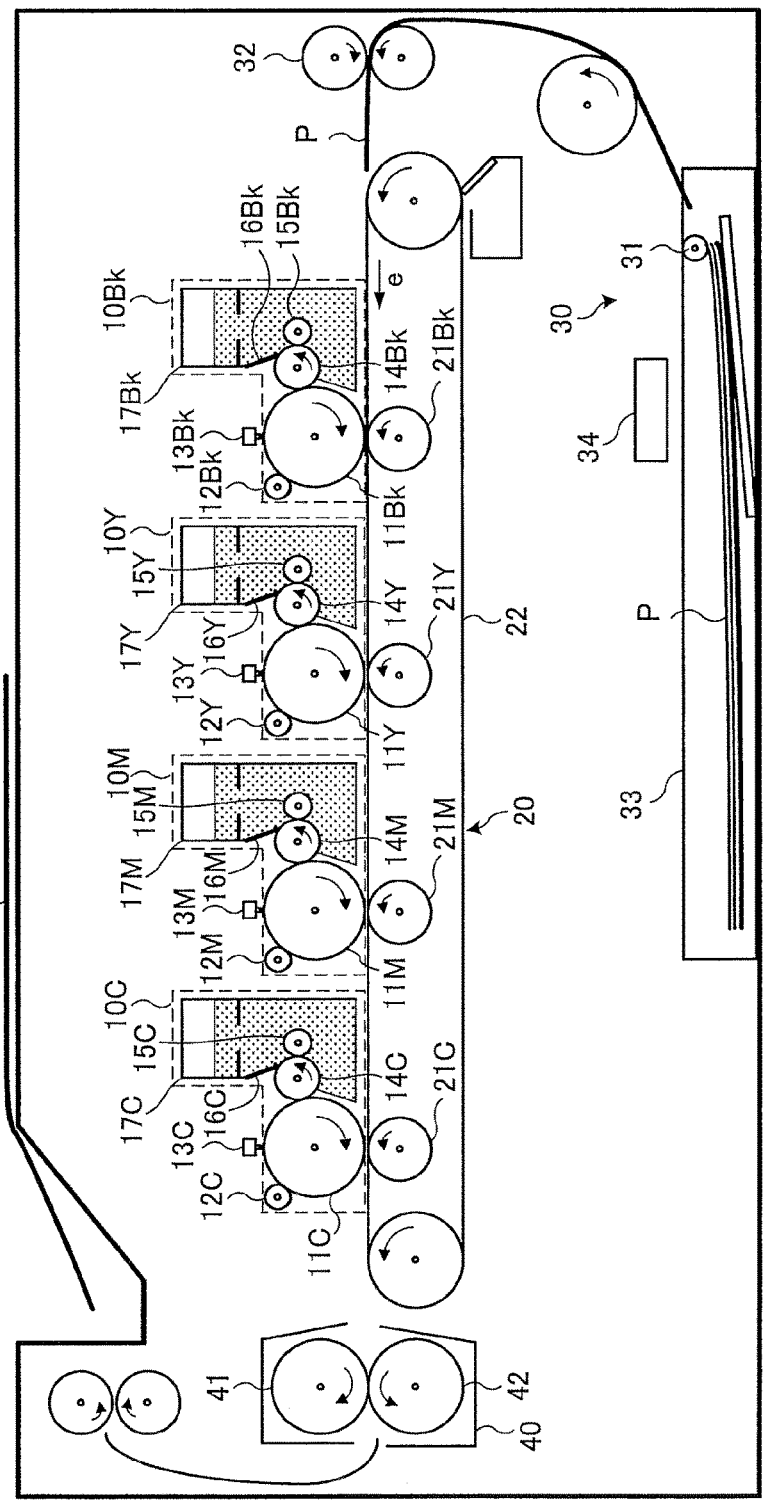
FIG. 1 is a cross-sectional view schematically illustrating a configuration of an image forming apparatus that includes light emitting diode (LED) heads as light exposure devices according to a first embodiment of the present invention.

FIG. 1 is a cross-sectional view schematically illustrating a configuration of an image forming apparatus 1 that includes LED heads 13Bk, 13Y, 13M, 13C as light exposure devices according to a first embodiment of the present invention.

The image forming apparatus 1 is an electrophotographic color printer that employs an electrophotographic method, for example. The image forming apparatus 1 includes image forming units 10Bk, 10Y, 10M, 10C, a transfer unit 20, a paper feeding mechanism 30 (a paper feeding unit), and a fuser 40 (a fusing unit). Note that the number of image forming units is not limited to four.

The image forming units 10Bk, 10Y, 10M, 10C include photoreceptor drums 11Bk, 11Y, 11M, 11C as image carriers, charging rollers 12Bk, 12Y, 12M, 12C as electric chargers, LED heads 13Bk, 13Y, 13M, 13C as light exposure devices, developing rollers 14Bk, 14Y, 14M, 14C as developing units (developer carriers), toner supplying rollers 15Bk, 15Y, 15M, 15C as developer supplying members, developing blades 16Bk, 16Y, 16M, 16C as developer regulating members, and toner cartridges 17Bk, 17Y, 17M, 17C as developer storage units, respectively.

The image forming units 10Bk, 10Y, 10M, 10C are four image forming units that are independent from each other. The image forming units 10Bk, 10Y, 10M, 10C are arranged in a direction (the direction indicated by an arrow e) in which a paper sheet P as a recording medium is conveyed.

The image forming units 10Bk, 10Y, 10M, 10C form, on the paper sheet P, images that are black, yellow, magenta, and cyan visible images (for example, toner images as developer images) respectively, by using the electrophotographic method.

In addition to the paper sheet P, an Overhead Projector (OHP) sheet, an envelope, copy paper, specialty paper, etc. may be used as the recording medium.

The charging rollers 12Bk, 12Y, 12M, 12C electrically charge uniformly the surfaces of the photoreceptor drums 11Bk, 11Y, 11M, 11C, respectively.

The LED heads 13Bk, 13Y, 13M, 13C are fixed above the photoreceptor drums 11Bk, 11Y, 11M, 11C, so as to face the photoreceptor drums 11Bk, 11Y, 11M, 11C, respectively. The LED heads 13Bk, 13Y, 13M, 13C perform light exposure. For example, the LED heads 13Bk, 13Y, 13M, 13C each cause the LEDs to emit light in accordance with image data, and form electrostatic latent images on the surfaces of the photoreceptor drums 11Bk, 11Y, 11M, 11C.

The developing rollers 14Bk, 14Y, 14M, 14C supply toner as developer to the photoreceptor drums 11Bk, 11Y, 11M, 11C respectively, to form toner images.

The toner supplying rollers 15Bk, 15Y, 15M, 15C are pressed against the surfaces of the developing rollers 14Bk, 14Y, 14M, 14C, respectively. The toner supplying rollers 15Bk, 15Y, 15M, 15C supply the toner stored in the toner cartridges 17Bk, 17Y, 17M, 17C to the developing rollers 14Bk, 14Y, 14M, 14C, respectively.

The developing blades 16Bk, 16Y, 16M, 16C are pressed against the developing rollers 14Bk, 14Y, 14M, 14C, respectively. The developing blades 16Bk, 16Y, 16M, 16C create thin layers of the toner on the surfaces of the developing rollers 14Bk, 14Y, 14M, 14C, respectively.

The transfer unit 20 is fixed below the photoreceptor drums 11Bk, 11Y, 11M, 11C. The transfer unit 20 includes transfer rollers 21Bk, 21Y, 21M, 21C as transfer devices, and a conveyance belt 22 as a conveyance member. The conveyance belt 22 is supported in a rotatable manner by rollers, and conveys the paper sheet P in the direction indicated by the arrow e, for example.

The transfer rollers 21Bk, 21Y, 21M, 21C are located to face the photoreceptor drums 11Bk, 11Y, 11M, 11C with the conveyance belt 22 in between. The transfer rollers 21Bk, 21Y, 21M, 21C electrically charge the surface of the paper sheet P such that the polarity of the paper sheet is opposite to the polarity of the toner, and transfer the toner images on the photoreceptor drums 11Bk, 11Y, 11M, 11C to the paper sheet P, respectively.

The paper feeding mechanism 30 is located at a lower portion in the image forming apparatus 1, for example. The paper feeding mechanism 30 supplies the paper sheet P toward the conveyance belt 22. The paper feeding mechanism 30 includes a hopping roller 31, a registration roller 32, a paper sheet containing cassette 33 as a medium container, and a sheet color measuring unit 34.

The sheet color measuring unit 34 detects the color of the paper sheet P supplied from the paper sheet containing cassette 33.

The fuser 40 is located at a downstream side of the conveyance belt 22 in the conveyance direction in which the paper sheet P is conveyed. The fuser 40 includes a heating roller 41 and a backup roller 42. The fuser 40 fixes the toner transferred on the paper sheet P onto the paper sheet P by applying heat and pressure to the toner.

Further, the image forming apparatus 1 may include a pinch roller or an ejection roller for ejecting the paper sheet P to the outside of the image forming apparatus 1. Further, a paper sheet stacker for stacking the paper sheet P ejected from the inside of the image forming apparatus 1 may be formed in an upper part of the image forming apparatus 1.

<Structure of Light Exposure Device>

The structures of the LED heads 13Bk, 13Y, 13M, 13C as the light exposure devices will be described below.

Figure 2:
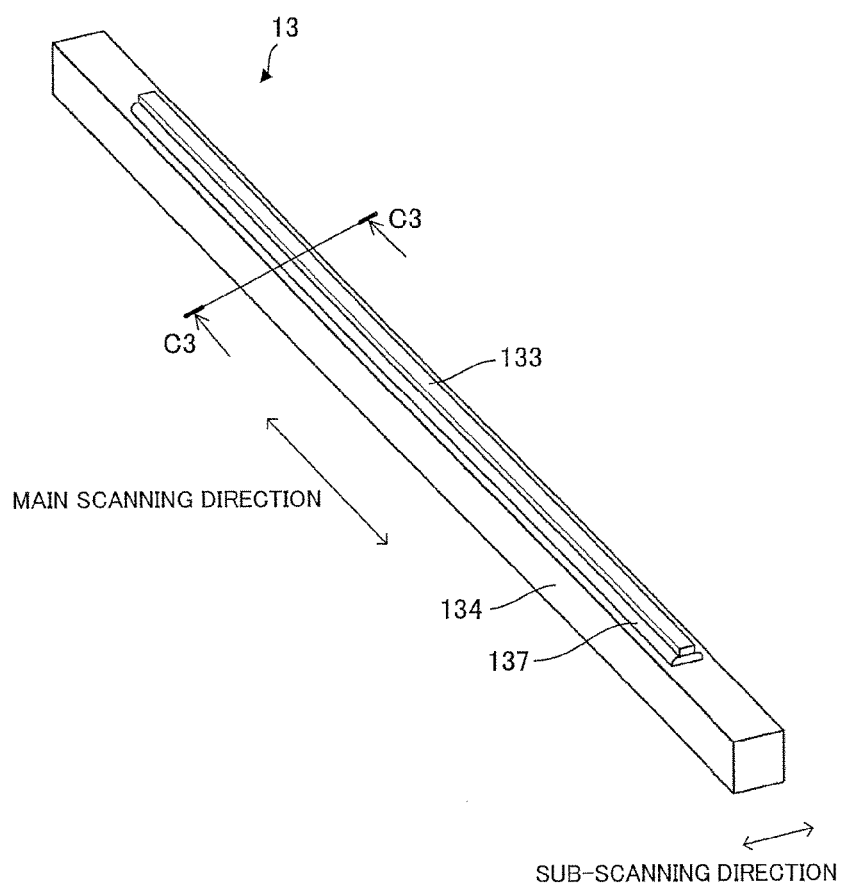
FIG. 2 is a perspective view schematically illustrating a structure of the LED head.
Figure 3:
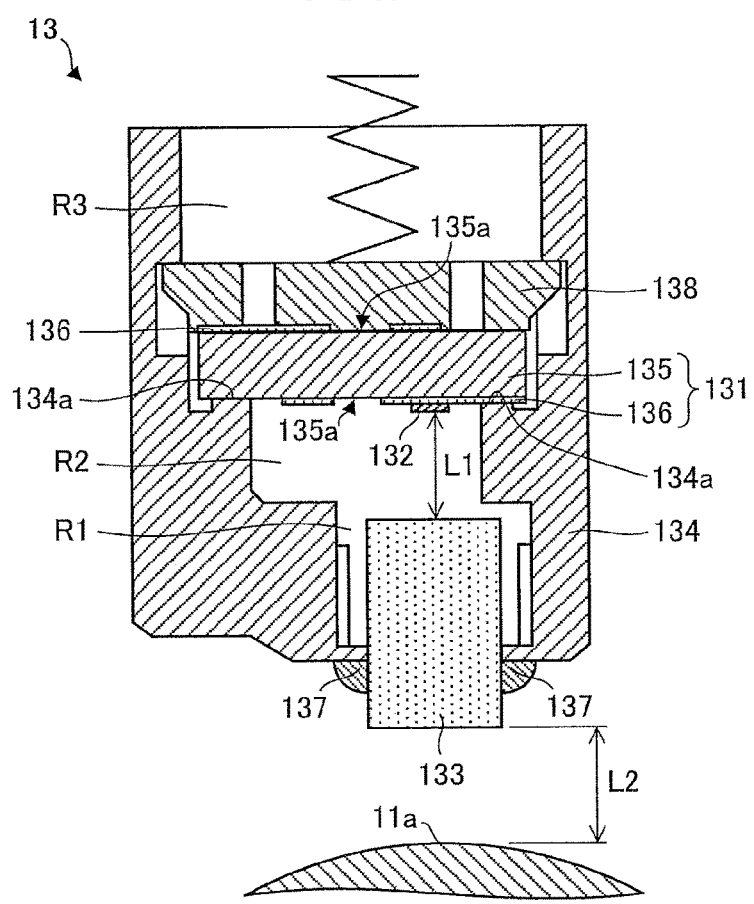
FIG. 3 is a cross-sectional view along a line C3-C3 in FIG. 2.

FIG. 2 is a perspective view schematically illustrating a structure of a LED head 13. FIG. 3 is a cross-sectional view along a line C3-C3 in FIG. 2. In the present embodiment, the LED heads 13Bk, 13Y, 13M, 13C have the same structure as each other, and thus each of the LED heads 13Bk, 13Y, 13M, 13C is referred to as "LED head 13". Note that the LED heads 13Bk, 13Y, 13M, 13C may have different structures from each other, and at least one of the LED heads 13Bk, 13Y, 13M, 13C may have the structure of the LED head 13.

The LED head 13 includes a substrate 131, a plurality of light emitting elements 132 as semiconductor elements, a converging lens 133, and a support member 134 (a lens array holder).

The substrate 131 is a multi-layer substrate that has a plurality of layers (wiring layers). In other words, the substrate 131 is an N-layer substrate (N is an even number equal to or greater than 2). In the present embodiment, the substrate 131 which is a two-layer substrate will be described. However, the substrate 131 may be formed to have one or more odd-number layers. That is, the substrate 131 may be an N-layer substrate (N is an integer equal to or greater than 1).

The substrate 131 includes a base material 135 (also referred to as "base member") and one or more metal wiring patterns 136 (hereafter, metal wiring patterns 136). The base material 135 has one or more wiring pattern formation surfaces 135a (hereafter, wiring pattern formation surfaces 135a) on which the metal wiring patterns 136 are formed. Further, the substrate 131 may be provided with a driver IC (Integrated Circuit) for controlling the plurality of light emitting elements 132.

The base material 135 is a base member of a glass epoxy material, such as Flame Retardant Type 4 (FR-4), for example. Although in the present embodiment the metal wiring patterns 136 are copper foil patterns made of copper, the material of the metal wiring patterns 136 is not limited to copper. The thermal expansion coefficient of the base material 135 is 11 ppm/° C. to 15 ppm/° C. for example, and the thermal expansion coefficient of the metal wiring patterns 136 is 16 ppm/° C. to 17 ppm/° C. for example.

The length of the base material 135 in the main scanning direction is 250 mm to 350 mm, for example. In the present embodiment, the length of the base material 135 in the main scanning direction is 300 mm, and the length of the base material 135 in the sub-scanning direction is 7 mm. The thickness of the base material 135 is 0.8 mm to 1.5 mm, for example. In the present embodiment, the thickness of the base material 135 is 1.0 mm.

Each light emitting element 132 is an LED chip that irradiates light, for example. In the present embodiment, an LED array chip as a light emitting element array is composed of a plurality of LED chips. The plurality of light emitting elements 132 are fixed on the substrate 131 (specifically, the wiring pattern formation surface 135a) so as to face the photoreceptor drum (for example, the photoreceptor drum 11Bk, 11Y, 11M, or 11C) with the converging lens 133 in between. In the example illustrated in FIG. 2, the plurality of light emitting elements 132 are arranged in the main scanning direction. Although in the present embodiment the LED head 13 has a resolution of 600 dpi, the LED head 13 may have a resolution other than 600 dpi.

The converging lens 133 converges the light radiated from each light emitting element 132. The converging lens 133 is supported by the support member 134 so as to face the photoreceptor drum (for example, the photoreceptor drum 11Bk, 11Y, 11M, or 11C). In other words, the converging lens 133 is disposed between the plurality of light emitting elements 132 and the photoreceptor drum (for example, the photoreceptor drum 11Bk, 11Y, 11M, or 11C). The light converged by the converging lens 133 is irradiated to an image formation position 11a on the surface of the photoreceptor drum. The converging lens 133 is a rod lens array composed of a plurality of rod lenses, for example.

A distance L1 from the light emitting elements 132 to the converging lens 133 is equal to a distance L2 from the converging lens 133 to the image formation position 11a.

The support member 134 supports the substrate 131 and the converging lens 133. The support member 134 is a die-cast product produced by injecting aluminum material into a die, for example.

As illustrated in FIG. 3, a space composed of a first space R1, a second space R2, and a third space R3 is formed inside the support member 134, for example. The converging lens 133 is contained in the first space R1 that faces the photoreceptor drum (for example, the photoreceptor drum 11Bk, 11Y, 11M, or 11C). The second space R2 is formed between the substrate 131 and the converging lens 133. The third space R3 is wider than the second space R2 in the sub-scanning direction. Therefore, a step is formed on an inner surface of the support member 134. The substrate 131 is in contact with a contact surface 134a formed by this step.

In order to prevent light and a foreign object from entering into the support member 134, a gap between the support member 134 and the converging lens 133 is covered by a cover member 137, for example. The cover member 137 is made of silicone material, for example.

Further, the LED head 13 may include a base member 138 as a press member for pressing the substrate 131 onto the contact surface 134a of the support member 134. The base member 138 is formed of elastic, flexible material, e.g., a thermoplastic resin. In the present embodiment, a general-purpose engineering plastic consisting of a glass fiber reinforced polyamide is used as the resin. Thus, the heat resistance, load-deflection temperature characteristics, and the like of the base member 138 can be improved, and the elastic force of the base member 138 can be stabilized for a long period.

Figure 4A:
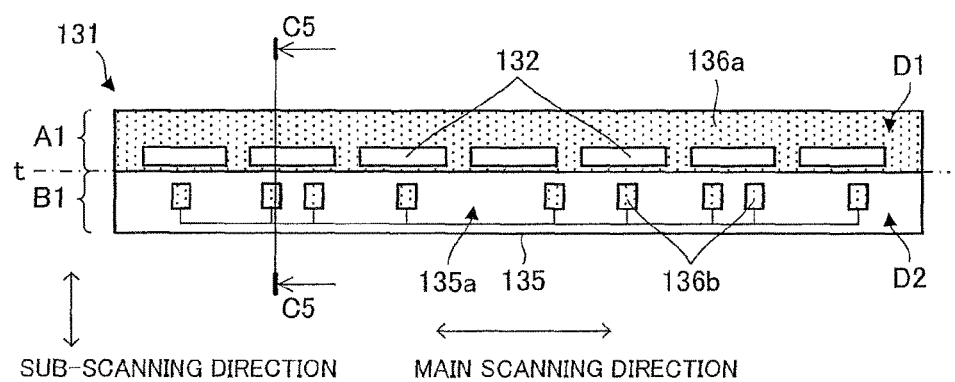
FIG. 4A is a plan view schematically illustrating a structure of a front side of a substrate.
Figure 4B:
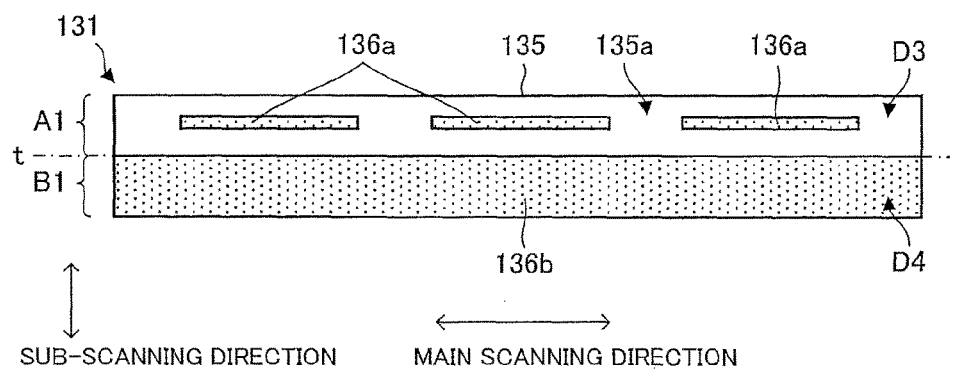
FIG. 4B is a plan view schematically illustrating a structure of a back side of a substrate.
Figures 5, 6:
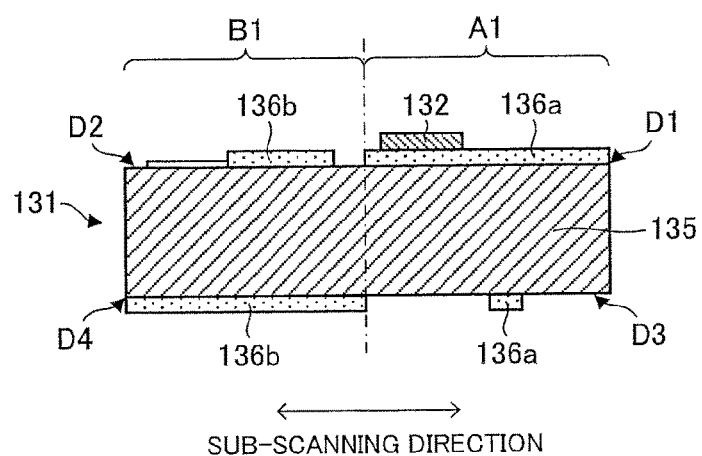
FIG. 5 is a cross-sectional view along a line C5-C5 in FIG. 4A.
FIG. 6 is a table illustrating an amount of warpage of the substrate in relation to a relationship between an occupancy ratio of metal wiring patterns in a first region and an occupancy ratio of metal wiring patterns in a second region.

FIG. 4A is a plan view schematically illustrating a structure of a front side of the substrate 131, and FIG. 4B is a plan view schematically illustrating a structure of a back side of the substrate 131. FIG. 5 is a cross-sectional view along a line C5-C5 in FIG. 4A.

The substrate 131 is longer in a first direction (also referred to as longer side direction or longitudinal direction). In other words, the substrate 131 extends in the first direction. The first direction is the main scanning direction, and a second direction (also referred to as shorter side direction or lateral direction) orthogonal to the first direction is the sub-scanning direction.

The substrate 131 is divided into two regions by a boundary line t which is a center line of the wiring pattern formation surface 135a in the second direction. One region of the two regions is a first region A1. The other region of the two regions is a second region B1. The boundary line t is a center line (imaginary line) that passes through the center of the substrate 131 in the sub-scanning direction.

In the present embodiment, the sum of the areas in the layers from the first layer to the N-th layer in the first region A1 and the sum of the areas in the layers from the first layer to the N-th layer in the second regions B1 are the same as each other. However, the areas in the layers from the first layer to the N-th layer in the first region A1 and the areas in the layers from the first layer to the N-th layer in the second region B1 may differ from each other. Further, the area of the first region A1 and the area of the second region B1 may differ from each other in each layer.

The metal wiring patterns 136 are formed on the wiring pattern formation surfaces 135a of the base material 135. In the present embodiment, the wiring pattern formation surface 135a on a front side of the base material 135 in the first region A1 is referred to as a wiring pattern formation surface D1; the wiring pattern formation surface 135a on the front side of the base material 135 in the second region B1 is referred to as a wiring pattern formation surface D2; the wiring pattern formation surface 135a on the back side of the base material 135 in the first region A1 is referred to as a wiring pattern formation surface D3; and the wiring pattern formation surface 135a on the back side of the base material 135 in the second region B1 is referred to as a wiring pattern formation surface D4.

The metal wiring patterns 136 are copper foil patterns formed from a copper foil, for example. However, the metal wiring patterns 136 may be wiring patterns formed of a material other than copper. For example, the metal wiring patterns 136 may be formed of a material including at least one of gold, silver, aluminum, nickel, and palladium.

For example, the copper foil patterns are formed by etching a copper foil on a copper-clad laminated plate, forming copper plating, and etching this again. The metal wiring patterns 136 include the copper foil patterns and copper plating. Further, the metal wiring patterns 136 include patterns of various shapes, such as a pad-like shapes and a pattern of lines.

In the following, the metal wiring pattern 136 formed in the first region A1 is referred to as a metal wiring pattern 136a (first metal wiring pattern), and the metal wiring pattern 136 formed in the second region B1 is referred to as a metal wiring pattern 136b (second metal wiring pattern).

The metal wiring patterns 136a are formed on the wiring pattern formation surfaces D1 and D3, and the metal wiring patterns 136b are formed on the wiring pattern formation surfaces D2 and D4. In the present embodiment, the metal wiring patterns 136a and 136b are formed of the same material as each other.

The metal wiring patterns 136 mainly serve a function as lines for supplying the light emitting elements 132 with an electric current. However, all the metal wiring patterns 136 are needless to be electrically connected to the light emitting elements 132. In the present embodiment, the metal wiring patterns 136a and 136b on the wiring pattern formation surfaces D1 and D2 are used as lines for supplying the light emitting elements 132 with an electric current, and the metal wiring patterns 136a and 136b on the wiring pattern formation surfaces D3 and D4 are dummy patterns.

For electrically connecting each of the light emitting elements 132 with the substrate 131, the metal wiring patterns 136b include wiring pattern components each formed like a pad, as illustrated in FIG. 4A, for example. In the present embodiment, the pad-like wiring pattern components concentrate in the second region B1. Hence, in some cases, the occupancy ratio (residual copper ratio) of the metal wiring patterns 136a in the first region A1 and the occupancy ratio (residual copper ratio) of the metal wiring patterns 136b in the second region B1 differ from each other.

The occupancy ratio (residual copper ratio) of the metal wiring patterns 136 is a ratio of the areas of the metal wiring patterns 136 (for example, the copper foil patterns and the copper plating) to the total area of a certain region. In other words, the occupancy ratio (residual copper ratio) of the metal wiring patterns 136 is a ratio of the sum of the areas of the metal wiring patterns 136 in a certain region to the sum of the areas of the wiring pattern formation surfaces 135a in the region.

For example, the occupancy ratio (residual copper ratio) of the metal wiring pattern 136 in the first region A1 of the first layer is a ratio of the sum of the area of the metal wiring pattern 136a on the wiring pattern formation surface D1 to the total area of the wiring pattern formation surface D1. For example, the occupancy ratio of the metal wiring patterns 136 in the first region A1 in the layers from the first layer to the second layer is a ratio of the sum of the areas of the metal wiring patterns 136a on the wiring pattern formation surfaces D1 and D3 to the sum of the areas of the wiring pattern formation surfaces D1 and D3.

In the same way, the occupancy ratio (residual copper ratio) of the metal wiring patterns 136 in the second region B1 of the first layer is a ratio of the sum of the areas of the metal wiring patterns 136b on the wiring pattern formation surface D2 to the total area of the wiring pattern formation surface D2. For example, the occupancy ratio of the metal wiring patterns 136 in the second region B1 in the layers from the first layer to the second layer is a ratio of the sum of the areas of the metal wiring patterns 136b on the wiring pattern formation surfaces D2 and D4 to the sum of the areas of the wiring pattern formation surfaces D2 and D4.

When the occupancy ratio of the metal wiring pattern 136a in the first region A1 of the first layer (i.e., the wiring pattern formation surface D1) is Aa %, and the occupancy ratio of the metal wiring pattern 136b in the second region B1 of the second layer (i.e., the wiring pattern formation surface D4) is Bb %, the LED head 13 satisfies $0.75 \times Bb \leq Aa \leq Bb$ or $0.75 \times Aa \leq Bb \leq Aa$ (i.e., $0.75 \leq Aa/Bb \leq 1$ or $0.75 \leq Bb/Aa \leq 1$). Accordingly, the warpage of the substrate 131 can be reduced, and the fluctuation of the radiation position of the light radiated from the plurality of light emitting elements 132 can be reduced.

Further, when the occupancy ratio of the metal wiring patterns 136b in the second region B1 of the first layer (i.e., the wiring pattern formation surface D2) is Ba %, and the occupancy ratio of the metal wiring patterns 136a in the first region A1 of the second layer (i.e., the wiring pattern formation surface D3) is Ab %, the LED head 13 satisfies $0.75 \times Ba \leq Ab \leq Ba$ or $0.75 \times Ab \leq Ba \leq Ab$ (i.e., $0.75 \leq Ab/Ba \leq 1$ or $0.75 \leq Ba/Ab \leq 1$). Accordingly, the warpage of the substrate 131 can be reduced.

Further, in the present embodiment, when the occupancy ratio of the metal wiring patterns 136a in the first region A1 in the layers from the first layer to the second layer is A %, and the occupancy ratio of the metal wiring patterns 136b in the second region B1 in the layers from the first layer to the second layer is B %, the LED head 13 satisfies $0.75 \times B \leq A \leq B$ or $0.75 \times A \leq B \leq A$ (i.e., $0.75 \leq A/B \leq 1$ or $0.75 \leq B/A \leq 1$). Accordingly, the warpage of the substrate 131 can be reduced effectively, and the fluctuation of the radiation position of the light radiated from the plurality of light emitting elements 132 can be reduced effectively.

When the area of the wiring pattern formation surface 135a (each of the wiring pattern formation surfaces D1 and D3) of each layer in the first region A1 and the area of the wiring pattern formation surface 135a (each of the wiring pattern formation surfaces D2 and D4) of each layer in the second region B1 are equal to each other, the relationship between the occupancy ratio of the metal wiring patterns 136a in the first region A1 and the occupancy ratio of the metal wiring patterns 136b in the second region B1 can be expressed by the relationship between the areas of the metal wiring patterns 136a in the first region A1 and the areas of the metal wiring patterns 136b in the second region B1.

In this case, when the sum of the area of the metal wiring pattern 136a in the first region A1 of the first layer (i.e., the wiring pattern formation surface D1) is Aa, and the sum of the area of the metal wiring pattern 136b in the second region B1 of the second layer (i.e., the wiring pattern formation surface D4) is Bb, the LED head 13 satisfies $0.75 \times Bb \leq Aa \leq Bb$ or $0.75 \times Aa \leq Bb \leq Aa$ (i.e., $0.75 \leq Aa/Bb \leq 1$ or $0.75 \leq Bb/Aa \leq 1$).

In the same way, when the sum of the areas of the metal wiring patterns 136b in the second region B1 of the first layer (i.e., the wiring pattern formation surface D2) is Ba, and the sum of the areas of the metal wiring patterns 136a in the first region A1 of the second layer (i.e., the wiring pattern formation surface D3) is Ab, the LED head 13 satisfies $0.75 \times Ba \leq Ab \leq Ba$ or $0.75 \times Ab \leq Ba \leq Ab$ (i.e., $0.75 \leq Ab/Ba \leq 1$ or $0.75 \leq Ba/Ab \leq 1$).

Further, when the total area of the wiring pattern formation surfaces 135a (the wiring pattern formation surfaces D1 and D3) in the first region A1 in the layers from the first layer to the second layer and the total area of the wiring pattern formation surfaces 135a (the wiring pattern formation surfaces D2 and D4) in the second region B1 in the layers from the first layer to the second layer are equal to each other, the relationship between the occupancy ratio of the metal wiring patterns 136a in the first region A1 in the layers from the first layer to the second layer and the occupancy ratio of the metal wiring patterns 136b in the second region B1 in the layers from the first layer to the second layer can be expressed by the relationship between the sum of the areas of the metal wiring patterns 136a in the first region A1 in the layers from the first layer to the second layer and the sum of the areas of the metal wiring patterns 136b in the second region B1 in the layers from the first layer to the second layer.

In this case, when the sum of the areas of the metal wiring patterns 136a in the first region A1 in the layers from the first layer to the second layer is A, and the sum of the areas of the metal wiring patterns 136b in the second region B1 in the layers from the first layer to the second layer is B, the LED head 13 satisfies 0.75×B≤A≤B or 0.75×A≤B≤A (i.e., 0.75≤A/B≤1 or 0.75≤B/A≤1).

<Operation of Image Forming Apparatus 1>

The operation of the image forming apparatus 1 will be described below.

When the image formation operation in the image forming apparatus 1 is started, the paper sheet P in the paper sheet containing cassette 33 is fed toward the registration roller 32 by the hopping roller 31. Subsequently, the paper sheet P is fed from the registration roller 32 to the conveyance belt 22, and is conveyed to the image forming units (the image forming units 10Bk, 10Y, 10M, 10C) as the conveyance belt 22 rotates.

In the image forming units 10Bk, 10Y, 10M, 10C, the surfaces of the photoreceptor drums 11Bk, 11Y, 11M, 11C are electrically charged by the charging rollers 12Bk, 12Y, 12M, 12C respectively, and electrostatic latent images are formed by the light emission of the LED heads 13Bk, 13Y, 13M, 13C.

Thin layers of toner on the developing rollers 14Bk, 14Y, 14M, 14C are attracted electrostatically onto the surfaces of the photoreceptor drums 11Bk, 11Y, 11M, 11C, respectively. Accordingly, toner images of respective colors based on the electrostatic latent images formed on the photoreceptor drums 11Bk, 11Y, 11M, 11C are formed on the photoreceptor drums 11Bk, 11Y, 11M, 11C.

The toner images of the respective colors are transferred onto the paper sheet P by the transfer rollers 21Bk, 21Y, 21M, 21C. Therefore, a color toner image is formed on the paper sheet P.

After the transfer process, the residual toner on the photoreceptor drums 11Bk, 11Y, 11M, 11C can be removed by cleaning devices, for example.

The paper sheet P on which the toner image is formed is sent to the fuser 40. In the fuser 40, the toner image is fused on the paper sheet P, and a color image is created. The paper sheet P on which the color image is created can be ejected to the paper sheet stacker by the ejection roller and the pinch roller, for example.

The color image is formed on the paper sheet P by the above process.

The effect of the LED head 13 (for example, the LED heads 13Bk, 13Y, 13M, 13C) as the light exposure device according to the first embodiment will be described below.

In general, when an electrostatic latent image is formed by an LED head in an image forming apparatus that employs the electrophotographic method, light emission by LEDs of the LED head causes heat to be generated in the LEDs. The heat is transferred to a substrate of the LED head, and a base material and a metal wiring pattern on the substrate are expanded by the heat in some cases. For example, when the occupancy ratio of the metal wiring patterns 136 on the base material 135 in the first region A1 differs from the occupancy ratio of the metal wiring patterns 136 on the base material 135 in the second region B1, the substrate 131 tends to warp in the sub-scanning direction.

In an image forming apparatus that uses an LED head of the same size as the LED head 13 used in the present embodiment, in particular, an LED head that has a resolution of 600 dpi, when a substrate of the LED head greatly warps, a color shift remarkably occurs in the image formation and printing quality significantly reduces. Hence, it is desirable to reduce the warpage of the substrate of the LED head, from the view point of printing quality.

FIG. 6 is a table illustrating the amount of warpage of the substrate 131 in relation to the relationship between the occupancy ratio A % of the metal wiring patterns 136a in the first region A1 and the occupancy ratio B % of the metal wiring patterns 136b in the second region B1 when the temperature of the substrate 131 rises from 25° C. to 70° C. The amount of warpage of the substrate 131 illustrated in FIG. 6 is calculated as described next. the positions (dot positions) of the light radiated from the light emitting elements 132 when the temperature of the substrate 131 rises from 25° C. to 70° C., are detected on the basis of the sub-scanning direction (also referred to as Y direction), and a regression line is calculated based on the detected values. On the basis of the calculated regression line (Y=0), the amount of warpage of the substrate 131 illustrated in FIG. 6 is calculated by subtracting the sum of the differences between each detected value on a −Y side and the regression line from the sum of the differences between each detected value on a +Y side and the regression line. The amount of warpage of the substrate 131 is desirably within 40 μm from the view point of printing quality.

As illustrated in FIG. 6, when the ratio R (i.e., A/B or B/A) between the occupancy ratio A % of the metal wiring patterns 136a in the first region A1 and the occupancy ratio B % of the metal wiring patterns 136b in the second region B1 satisfies 0.9≤R≤1 (i.e., 0.9≤A/B≤1 or 0.9≤B/A≤1), the amount of warpage of the substrate 131 is 10 μm. When the ratio R satisfies 0.75≤R≤1 (i.e., 0.75≤A/B≤1 or 0.75≤B/A≤1), the amount of warpage of the substrate 131 is 30 μm. When the ratio R satisfies 0.70≤R≤1 (i.e., 0.70≤A/B≤1 or 0.70≤B/A≤1), the amount of warpage of the substrate 131 is 40 μm.

The result illustrated in FIG. 6 indicates that, when the ratio R satisfies 0.70≤R<0.75, there is not a sufficient margin from a threshold value of color shift generation, and thus it is desirable that the ratio R satisfies 0.75≤R≤1. Further, when the ratio R satisfies 0.9≤R≤1, there is more sufficient margin from the threshold value of color shift generation, and the printing quality of the image forming apparatus 1 can be increased.

As described above, when the occupancy ratio of the metal wiring patterns 136a in the first region A1 is A %, and the occupancy ratio of the metal wiring patterns 136b in the second region B1 is B %, the LED head 13 according to the first embodiment satisfies 0.75×B≤A≤B or 0.75×A≤B≤A (i.e., 0.75≤A/B≤1 or 0.75≤B/A≤1). Therefore, it is possible to provide the LED head 13 capable of reducing the warpage of the substrate 131 can be provided even when the temperature of the substrate 131 rises. In particular, the LED head 13 can make it difficult for the substrate 131 to warp in the sub-scanning direction.

As described above, the LED head 13 according to the first embodiment can suppress the amount of warpage of the substrate 131 in the sub-scanning direction within 30 μm. Accordingly, when the electrostatic latent image is formed on the photoreceptor drum in the image forming apparatus 1, the positional shift of the electrostatic latent image formed on the photoreceptor drum can be prevented, and high quality printing can be performed, for example.

Further, when the relationship between the occupancy ratio A % of the metal wiring patterns 136a in the first region A1 and the occupancy ratio B % of the metal wiring patterns 136b in the second region B1 satisfies 0.9×B≤A≤B or 0.9×A≤B≤A (i.e., 0.9≤A/B≤1 or 0.9≤B/A≤1), the printing quality of the image forming apparatus 1 can be further increased.

Further, even when the external environment of the image forming apparatus 1 changes, in particular even when the air temperature rises, warpage of the substrate 131 in the sub-scanning direction is unlikely to occur, and the printing quality of the image forming apparatus 1 can be increased.

First Variant Example of First Embodiment

Figure 7A:
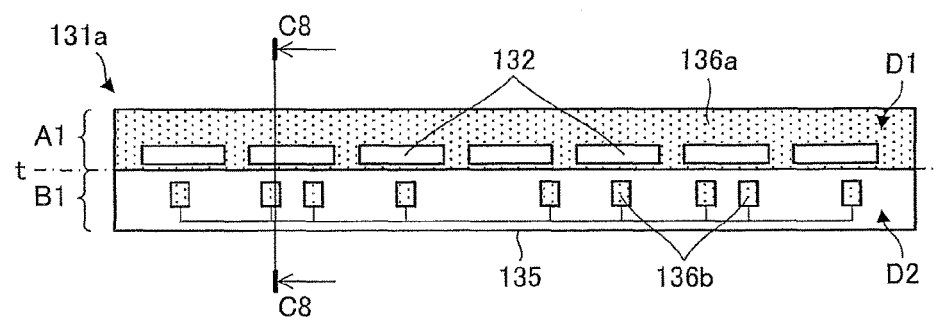
FIGS. 7A and 7B are plan views schematically illustrating a structure of a substrate of an LED head as a light exposure device according to a first variant example of the first embodiment.
Figure 7B:
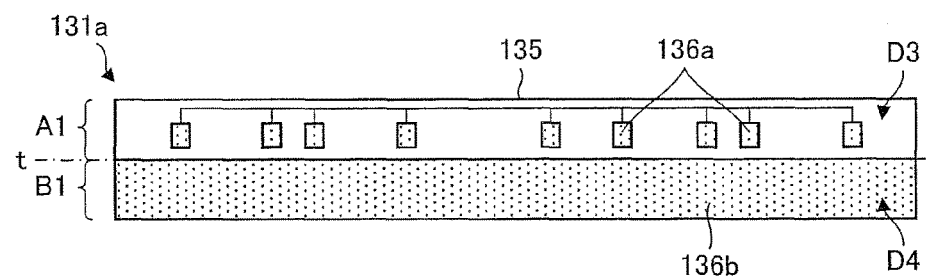
Figure 8:
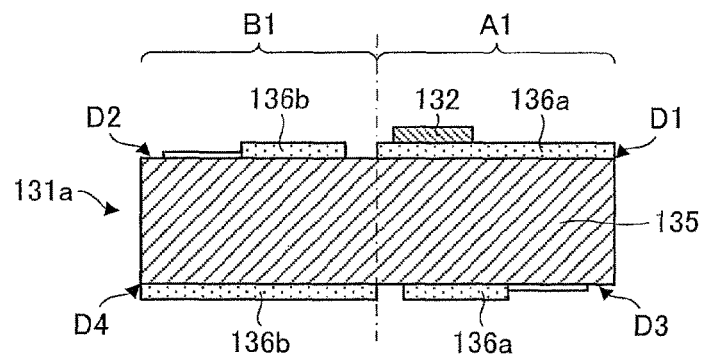
FIG. 8 is a cross-sectional view along a line C8-C8 in FIG. 7A.

FIGS. 7A and 7B are plan views schematically illustrating the structure of a substrate 131a of an LED head as a light exposure device according to a first variant example of the first embodiment. Specifically, FIG. 7A is a plan view schematically illustrating the structure of a front side of the substrate 131a, and FIG. 7B is a plan view schematically illustrating the structure of a back side of the substrate 131a. FIG. 8 is a cross-sectional view along a line C8-C8 in FIG. 7A.

The structure of the metal wiring patterns 136a and 136b of the substrate 131a is applicable to the substrate 131 of the LED head 13 according to the first embodiment. That is, the structure of the metal wiring patterns 136a and 136b of the substrate 131a is applicable to at least one of the layers (wiring layers) of the substrate 131 of the LED head 13 according to the first embodiment.

The metal wiring pattern 136a on the wiring pattern formation surface D1 is formed in a reflectively inverted wiring pattern (wiring pattern structure) of the metal wiring pattern 136b on the wiring pattern formation surface D4. In other words, the metal wiring pattern 136a on the wiring pattern formation surface D1 and the metal wiring pattern 136b on the wiring pattern formation surface D4 are reflectively symmetrical (line symmetry) to each other. In the same way, the metal wiring patterns 136b on the wiring pattern formation surface D2 are formed in reflectively inverted wiring patterns of the metal wiring patterns 136a on the wiring pattern formation surface D3. In other words, the metal wiring patterns 136b on the wiring pattern formation surface D2 and the metal wiring patterns 136a on the wiring pattern formation surface D3 are reflectively symmetrical (line symmetry) to each other.

That is, the metal wiring patterns 136 of the first layer are formed in reflectively inverted wiring patterns of the metal wiring patterns 136 of the second layer. In other words, the metal wiring patterns 136 of the first layer and the metal wiring patterns 136 of the second layer are reflectively symmetrical to each other. Thus, when the occupancy ratio of the metal wiring patterns 136a in the first region A1 in the layers from the first layer to the second layer is A %, and the occupancy ratio of the metal wiring patterns 136b in the second region B1 in the layers from the first layer to the second layer is B %, the LED head according to the first variant example of the first embodiment satisfies A=B. However, the occupancy ratio of the metal wiring patterns 136a in the first region A1 and the occupancy ratio of the metal wiring patterns 136b in the second region B1 are needless to be strictly the same as each other. Thus, the LED head according to the first variant example of the first embodiment satisfies 0.75×B≤A≤B or 0.75×A≤B≤A (i.e., 0.75≤A/B≤1 or 0.75≤B/A≤1) in the same way as the first embodiment.

In other words, when the sum of the areas of the metal wiring patterns 136a in the first region A1 in the layers from the first layer to the second layer is A, and the sum of the areas of the metal wiring patterns 136b in the second region B1 in the layers from the first layer to the second layer is B, the LED head according to the first variant example of the first embodiment satisfies A=B. In this case, the amount of the metal wiring patterns 136a in the first region A1 in the layers from the first layer to the second layer and the amount of the metal wiring patterns 136b in the second region B1 in the layers from the first layer to the second layer are desirably equal to each other. However, the sum of the areas of the metal wiring patterns 136a in the first region A1 in the layers from the first layer to the second layer and the sum of the areas of the metal wiring patterns 136b in the second region B1 in the layers from the first layer to the second layer are needless to be strictly equal to each other.

The LED head according to the first variant example of the first embodiment has the same effect as the LED head 13 described in the first embodiment. Further, the warpage of the substrate 131a can be prevented more effectively by satisfying the relationship of A=B as described above. Accordingly, the printing quality in the image forming apparatus 1 can be increased.

Second Variant Example of First Embodiment

Figure 9:
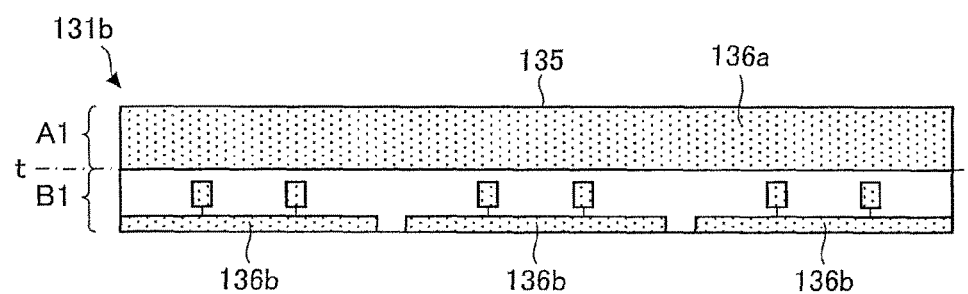
FIG. 9 is a plan view schematically illustrating a structure of a substrate of an LED head as a light exposure device according to a second variant example of the first embodiment.

FIG. 9 is a plan view schematically illustrating the structure of a substrate 131b of an LED head as a light exposure device according to a second variant example of the first embodiment. The structure of the metal wiring patterns 136a and 136b of the substrate 131b is applicable to the substrate 131 of the LED head 13 according to the first embodiment. That is, the structure of the metal wiring patterns 136a and 136b of the substrate 131b is applicable to at least one of the layers (wiring layers) of the substrate 131 of the LED head 13 according to the first embodiment.

In at least one of the first region A1 and the second region B1, a plurality of metal wiring patterns are arranged in the main scanning direction, and the plurality of metal wiring patterns are formed in a divided manner from each other. In other words, in at least one of the first region A1 and the second region B1, the metal wiring patterns are formed intermittently in the main scanning direction. In the example illustrated in FIG. 9, a plurality of metal wiring patterns 136b are arranged in the main scanning direction, and the plurality of metal wiring patterns 136b are formed in a divided manner from each other in the second region B1 of the substrate 131b.

Each of the metal wiring patterns 136b can be used for different purposes from each other, such as electric power supply and data transmission. In other words, the plurality of metal wiring patterns 136b are divided from each other, and thus can transmit signals that differ from each other. Further, the LED head according to the second variant example of the first embodiment has the same effect as the LED head 13 described in the first embodiment.

Third Variant Example of First Embodiment

Figure 10:
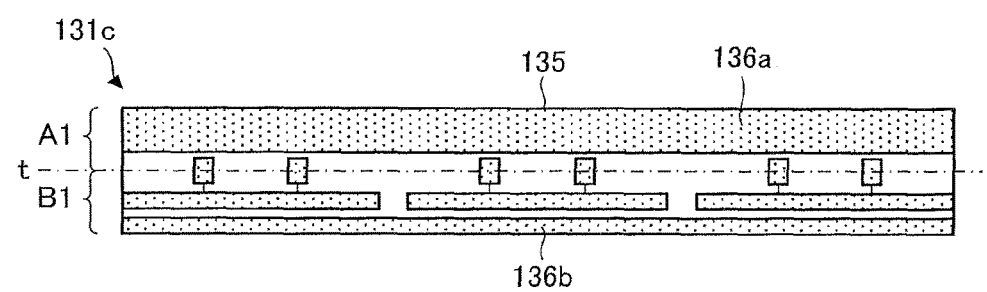
FIG. 10 is a plan view schematically illustrating a structure of a substrate of an LED head as a light exposure device according to a third variant example of the first embodiment.

FIG. 10 is a plan view schematically illustrating the structure of a substrate 131c of an LED head as a light exposure device according to a third variant example of the first embodiment. The structure of the metal wiring patterns 136a and 136b of the substrate 131c is applicable to the substrate 131 of the LED head 13 according to the first embodiment. That is, the structure of the metal wiring patterns 136a and 136b of the substrate 131c is applicable to at least one of the layers (wiring layers) of the substrate 131 of the LED head 13 according to the first embodiment.

In the substrate 131c, at least one of the metal wiring patterns 136a and 136b is formed continuously in the main scanning direction. In other words, in at least one of the first region A1 and the second region B1, the metal wiring pattern is formed continuously in the main scanning direction. Accordingly, even when the moisture of the base material 135 fluctuates (moisture removal or moisture absorption), the warpage of the substrate 131c in the sub-scanning direction can be reduced. In the example illustrated in FIG. 10, both of the metal wiring patterns 136a and 136b are formed continuously in the main scanning direction. Accordingly, the warpage of the substrate 131c in the sub-scanning direction can be effectively reduced as compared with a substrate on which one of the metal wiring patterns 136a and 136b is formed continuously in the main scanning direction.

The metal wiring patterns 136a and 136b formed continuously in the main scanning direction can be used as power supply lines or ground connection lines, for example. Further, the LED head according to the third variant example of the first embodiment has the same effect as the LED head 13 described in the first embodiment.

Second Embodiment

Figure 12:
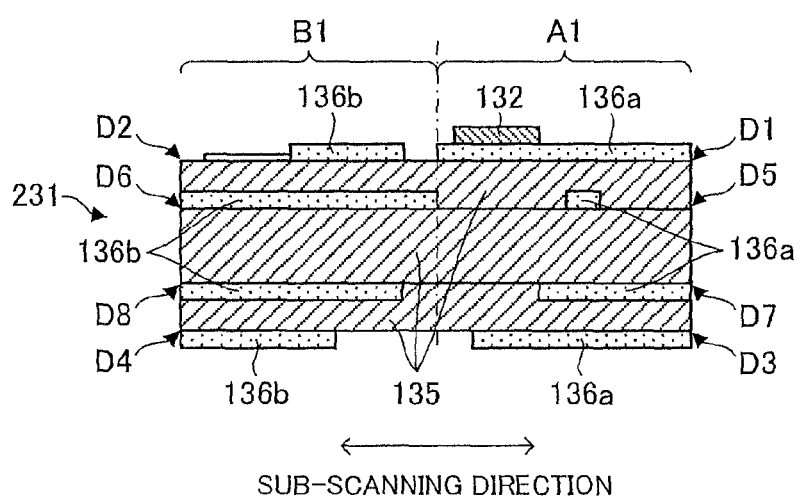
FIG. 12 is a cross-sectional view along a line C12-C12 in FIG. 11A.

FIGS. 11A to 11D are plan views schematically illustrating the structure of a substrate 231 of an LED head as a light exposure device according to a second embodiment of the present invention. Specifically, FIG. 11A is a plan view schematically illustrating the structure of a first layer of the substrate 231 (the structure of a front side of the substrate 231) of the LED head according to the second embodiment; FIG. 11B is a plan view schematically illustrating the structure of a second layer of the substrate 231 (the structure as seen from the front side of the substrate 231); FIG. 11C is a plan view schematically illustrating the structure of a third layer of the substrate 231 (the structure as seen from a back side of the substrate 231); and FIG. 11D is a plan view schematically illustrating the structure of a fourth layer of the substrate 231 (the structure of the back side of the substrate 231). FIG. 12 is a cross-sectional view along a line C12-C12 in FIG. 11A.

The LED head according to the second embodiment differs from the LED head 13 according to the first embodiment in that the LED head according to the second embodiment includes the substrate 231 of a four-layer substrate, and is the same as the LED head 13 in other points. Specifically, the substrate 231 of the LED head according to the second embodiment differs from the substrate 131 of the LED head 13 in that the substrate 231 includes the second layer (wiring pattern formation surfaces D5 and D6) and the third layer (wiring pattern formation surfaces D7 and D8) which are intermediate layers. The LED head according to the second embodiment is applicable to the image forming apparatus 1, in place of the LED head 13 according to the first embodiment.

In the following, the second embodiment will be described by using the same reference signs as the elements described in the first embodiment for the elements that are the same as or corresponding to the elements described in the first embodiment.

The substrate 231 is longer in the first direction. In other words, the substrate 231 extends in the first direction. The first direction is the main scanning direction, and the second direction orthogonal to the first direction is the sub-scanning direction.

In the present embodiment, the wiring pattern formation surface 135a on the first layer (the front side of the base material 135) in the first region A1 is referred to as wiring pattern formation surface D1; the wiring pattern formation surface 135a on the first layer in the second region B1 is referred to as wiring pattern formation surface D2; the wiring pattern formation surface 135a on the fourth layer (the back side of the base material 135) in the first region A1 is referred to as wiring pattern formation surface D3; and the wiring pattern formation surface 135a on the fourth layer in the second region B1 is referred to as wiring pattern formation surface D4.

Further, in the present embodiment, the wiring pattern formation surface on the second layer in the first region A1 is referred to as wiring pattern formation surface D5; the wiring pattern formation surface on the second layer in the second region B1 is referred to as wiring pattern formation surface D6; the wiring pattern formation surface on the third layer in the first region A1 is referred to as wiring pattern formation surface D7; and the wiring pattern formation surface on the third layer in the second region B1 is referred to as wiring pattern formation surface D8.

the one or more metal wiring patterns 136a (hereafter, metal wiring patterns 136a) are formed on the wiring pattern formation surfaces D1, D3, D5, and D7, and the one or more metal wiring patterns 136b (hereafter, metal wiring patterns 136b) are formed on the wiring pattern formation surfaces D2, D4, D6, and D8.

The formation method and the material of the metal wiring patterns 136a and 136b are the same as those in the first embodiment.

In the present embodiment, the metal wiring patterns 136a and 136b on the first layer and the fourth layer (the wiring pattern formation surfaces D1, D2, D3, and D4) can be used as electrical wiring, for example. In this case, the metal wiring patterns 136a and 136b on the second layer and the third layer (the wiring pattern formation surfaces D5, D6, D7, and D8) are dummy patterns.

In the present embodiment, the occupancy ratio (residual copper ratio) of the metal wiring patterns 136 in the first region A1 in the layers from the first layer to the fourth layer is a ratio of the areas of the metal wiring patterns 136a to the total area of the wiring pattern formation surfaces D1, D3, D5, and D7. Likewise, the occupancy ratio (residual copper ratio) of the metal wiring patterns 136 in the second region B1 in the layers from the first layer to the fourth layer is a ratio of the areas of the metal wiring patterns 136b to the total area of the wiring pattern formation surfaces D2, D4, D6, and D8.

In the same way as the first embodiment, the occupancy ratio of the metal wiring patterns 136 in each region of each layer is expressed by a ratio of the areas of the metal wiring patterns 136 to the area of each wiring pattern formation surface D1, D2, D3, D4, D5, D6, D7, or D8.

When the occupancy ratio of the metal wiring pattern 136a in the first region A1 of the first layer (i.e., the wiring pattern formation surface D1) is Aa %, and the occupancy ratio of the metal wiring pattern 136b in the second region B1 of the second layer (i.e., the wiring pattern formation surface D6) is Bb %, the LED head according to the second embodiment satisfies $0.75 \times Bb \leq Aa \leq Bb$ or $0.75 \times Aa \leq Bb \leq Aa$ (i.e., $0.75 \leq Aa/Bb \leq 1$ or $0.75 \leq Bb/Aa \leq 1$). Accordingly, the warpage of the substrate 231 can be reduced.

Further, when the occupancy ratio of the metal wiring patterns 136b in the second region B1 of the first layer (i.e., the wiring pattern formation surface D2) is Ba %, and the occupancy ratio of the metal wiring patterns 136a in the first region A1 of the second layer (i.e., the wiring pattern formation surface D5) is Ab %, the LED head according to the second embodiment satisfies 0.75×Ba≤Ab≤Ba or 0.75×Ab≤Ba≤Ab (i.e., 0.75≤Ab/Ba≤1 or 0.75≤Ba/Ab≤1). Accordingly, the warpage of the substrate 231 can be reduced.

Further, when the occupancy ratio of the metal wiring pattern 136a in the first region A1 of the third layer (i.e., the wiring pattern formation surface D7) is Ac %, and the occupancy ratio of the metal wiring pattern 136b in the second region B1 of the fourth layer (i.e., the wiring pattern formation surface D4) is Bd %, the LED head according to the second embodiment satisfies 0.75×Bd≤Ac≤Bd or 0.75×Ac≤Bd≤Ac (i.e., 0.75≤Ac/Bd≤1 or 0.75≤Bd/Ac≤1). Accordingly, the warpage of the substrate 231 can be reduced.

Further, when the occupancy ratio of the metal wiring pattern 136b in the second region B1 of the third layer (i.e., the wiring pattern formation surface D8) is Bc %, and the occupancy ratio of the metal wiring pattern 136a in the first region A1 of the fourth layer (i.e., the wiring pattern formation surface D3) is Ad %, the LED head according to the second embodiment satisfies 0.75×Bc≤Ad≤Bc or 0.75×Ad≤Bc≤Ad (i.e., 0.75≤Ad/Bc≤1 or 0.75≤Bc/Ad≤1). Accordingly, the warpage of the substrate 231 can be reduced.

Further, in the same way as the first embodiment, when the occupancy ratio of the metal wiring patterns 136a in the first region A1 in the layers from the first layer to the fourth layer is A %, and the occupancy ratio of the metal wiring patterns 136b in the second region B1 in the layers from the first layer to the fourth layer is B %, the LED head according to the second embodiment satisfies 0.75×B≤A≤B or 0.75×A≤B≤A (i.e., 0.75≤A/B≤1 or 0.75≤B/A≤1). Accordingly, the warpage of the substrate 231 can be reduced effectively, and the fluctuation of the irradiation position of the light irradiated from the plurality of light emitting elements 132 can be reduced effectively.

In the same way as the first embodiment, when the total area of the wiring pattern formation surfaces in the first region A1 in the layers from the first layer to the fourth layer (the wiring pattern formation surfaces D1, D3, D5, and D7) and the total area of the wiring pattern formation surfaces in the second region B1 in the layers from the first layer to the fourth layer (the wiring pattern formation surfaces D2, D4, D6, and D8) are equal to each other, the relationship between the occupancy ratio of the metal wiring patterns 136a in the first region A1 in the layers from the first layer to the fourth layer and the occupancy ratio of the metal wiring patterns 136b in the second region B1 in the layers from the first layer to the fourth layer can be expressed by the relationship between the sum of the areas of the metal wiring patterns 136a in the first region A1 in the layers from the first layer to the fourth layer and the sum of the areas of the metal wiring patterns 136b in the second region B1 in the layers from the first layer to the fourth layer.

In this case, when the sum of the areas of the metal wiring patterns 136a in the first region A1 in the layers from the first layer to the fourth layer is A, and the sum of the areas of the metal wiring patterns 136b in the second region B1 in the layers from the first layer to the fourth layer is B, the LED head according to the second embodiment satisfies 0.75≤A/B≤1 or 0.75≤B/A≤1.

The LED head according to the second embodiment has the same effect as the LED head 13 described in the first embodiment. Further, the LED head according to the second embodiment includes the one or more intermediate layers, and thus can make it easy to set the occupancy ratio of the metal wiring patterns 136, as compared with an LED head that does not include the one or more intermediate layers.

Although the substrate 231 of four-layer substrate has been described in the present embodiment, the substrate 231 may be formed to have even-number layers which are equal to or more than six layers. In other words, the substrate 231 may be an N-layer substrate (N is an even number equal to or greater than 6). Further, the substrate 231 may be formed to have odd-number layers which are equal to or more than three layers. In other words, the substrate 231 may be an N-layer substrate (N is an integer equal to or greater than 3).

Variant Example of Second Embodiment

Figure 14:
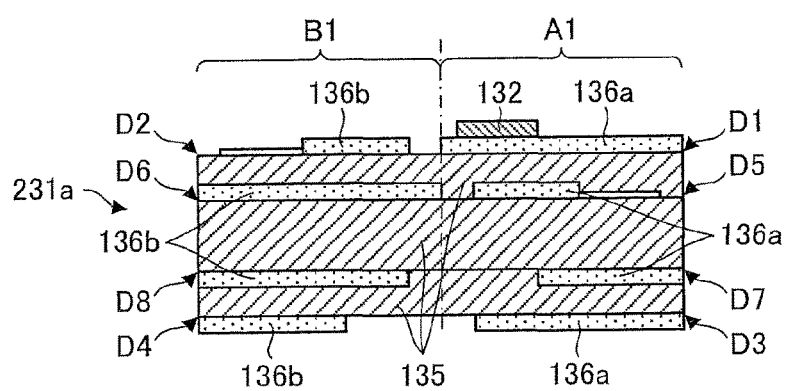
FIG. 14 is a cross-sectional view along a line C14-C14 in FIG. 13A.

FIGS. 13A to 13D are plan views schematically illustrating the structure of a substrate 231a of the LED head as the light exposure device according to a variant example of the second embodiment. FIG. 14 is a cross-sectional view along a line C14-C14 in FIG. 13A.

The substrate 231a of an LED head according to the variant example of the second embodiment differs from the substrate 231 of the LED head according to the second embodiment (FIG. 11B) in the structure of the metal wiring patterns 136 in the second layer (FIG. 13B), and are the same as the substrate 231 of the LED head according to the second embodiment in other points. The LED head according to the variant example of the second embodiment is applicable to the image forming apparatus 1, in place of the LED head 13 according to the first embodiment.

The metal wiring pattern 136a on the wiring pattern formation surface D1 is formed in a reflectively inverted wiring pattern of the metal wiring pattern 136b on the wiring pattern formation surface D6. In other words, the metal wiring pattern 136a on the wiring pattern formation surface D1 and the metal wiring pattern 136b on the wiring pattern formation surface D6 are reflectively symmetrical to each other.

In the same way, the metal wiring patterns 136b on the wiring pattern formation surface D2 are formed in reflectively inverted wiring patterns of the metal wiring patterns 136a on the wiring pattern formation surface D5. In other words, the metal wiring patterns 136b on the wiring pattern formation surface D2 and the metal wiring patterns 136a on the wiring pattern formation surface D5 are reflectively symmetrical to each other.

In the same way, the metal wiring pattern 136a on the wiring pattern formation surface D7 is formed in a reflectively inverted wiring pattern of the metal wiring pattern 136b on the wiring pattern formation surface D4. In other words, the metal wiring pattern 136a on the wiring pattern formation surface D7 and the metal wiring pattern 136b on the wiring pattern formation surface D4 are reflectively symmetrical to each other.

In the same way, the metal wiring pattern 136b on the wiring pattern formation surface D8 is formed in a reflectively inverted wiring pattern of the metal wiring pattern 136a on the wiring pattern formation surface D3. In other words, the metal wiring pattern 136b on the wiring pattern formation surface D8 and the metal wiring pattern 136a on the wiring pattern formation surface D3 are reflectively symmetrical to each other.

That is, the metal wiring patterns 136 of the first layer are formed in reflectively inverted wiring patterns of the metal wiring patterns 136 of the second layer, and the metal wiring patterns 136 of the third layer are formed in reflectively inverted wiring patterns of the metal wiring patterns 136 of the fourth layer. In other words, the metal wiring patterns 136 of the first layer and the metal wiring patterns 136 of the second layer are reflectively symmetrical to each other, and the metal wiring patterns 136 of the third layer and the metal wiring patterns 136 of the fourth layer are reflectively symmetrical to each other.

Thus, when the occupancy ratio of the metal wiring patterns 136a in the first region A1 in the layers from the first layer to the fourth layer is A %, and the occupancy ratio of the metal wiring patterns 136b in the second region B1 in the layers from the first layer to the fourth layer is B %, the LED head according to the variant example of the second embodiment satisfies A=B. However, the occupancy ratio of the metal wiring patterns 136a in the first region A1 and the occupancy ratio of the metal wiring patterns 136b in the second region B1 are needless to be strictly the same as each other. Thus, in the same way as the second embodiment, the LED head according to the variant example of the second embodiment satisfies $0.75 \times B \leq A \leq B$ or $0.75 \times A \leq B \leq A$ (i.e., $0.75 \leq A/B \leq 1$ or $0.75 \leq B/A \leq 1$).

In other words, when the sum of the areas of the metal wiring patterns 136a in the first region A1 in the layers from the first layer to the fourth layer is A, and the sum of the areas of the metal wiring patterns 136b in the second region B1 in the layers from the first layer to the fourth layer is B, the LED head according to the variant example of the second embodiment satisfies A=B. In this case, the amount of the metal wiring patterns 136a in the first region A1 in the layers from the first layer to the fourth layer and the amount of the metal wiring patterns 136b in the second region B1 in the layers from the first layer to the fourth layer are desirably equal to each other. However, the sum of the areas of the metal wiring patterns 136a in the first region A1 and the sum of the areas of the metal wiring patterns 136b in the second region B1 are needless to be strictly equal to each other.

The LED head according to the variant example of the second embodiment has the same effect as the LED head described in the second embodiment. Further, the warpage of the substrate 231a can be prevented more effectively by satisfying the relationship of A=B as described above. Accordingly, the printing quality in the image forming apparatus 1 can be increased.

Although the first embodiment (including each variant example) has described the substrate 131 of two-layer substrate, and the second embodiment (including the variant example) has described the substrate 231 of four-layer substrate, the substrate applied to the LED head described in the first or second embodiment may be an N-layer substrate including a first layer to an N-th layer (N is an integer equal to or greater than 1). That is, the N-th layer includes at least one layer (wiring layer). This N-layer substrate includes the wiring pattern formation surface 135a in each layer. In this case, when the occupancy ratio of the one or more metal wiring patterns 136a (hereafter, metal wiring patterns 136a) in the first region A1 in the layers from the first layer to the N-th layer (N is an integer equal to or greater than 1) is An %, and the occupancy ratio of the one or more metal wiring patterns 136b (hereafter, metal wiring patterns 136b) in the second region B1 in the layers from the first layer to the N-th layer is Bn %, this LED head satisfies $0.75 \times Bn \leq An \leq Bn$ or $0.75 \times An \leq Bn \leq An$ (i.e., $0.75 \leq An/Bn \leq 1$ or $0.75 \leq Bn/An \leq 1$).

When the total area of the one or more wiring pattern formation surfaces 135a (hereafter, wiring pattern formation surfaces 135a) in the first region A1 in the layers from the first layer to the N-th layer (N is an integer equal to or greater than 1) and the total area of the wiring pattern formation surfaces 135a in the second region B1 in the layers from the first layer to the N-th layer are equal to each other, the relationship between the occupancy ratio of the metal wiring patterns 136a in the first region A1 in the layers from the first layer to the N-th layer and the occupancy ratio of the metal wiring patterns 136b in the second region B1 in the layers from the first layer to the N-th layer can be expressed by the relationship between the sum of the areas of the metal wiring patterns 136a in the first region A1 in the layers from the first layer to the N-th layer and the sum of the areas of the metal wiring patterns 136b in the second region B1 in the layers from the first layer to the N-th layer. In this case, when the sum of the areas of the metal wiring patterns 136a in the first region A1 in the layers from the first layer to the N-th layer is An, and the sum of the areas of the metal wiring patterns 136b in the second region B1 in the layers from the first layer to the N-th layer is Bn, this LED head satisfies $0.75 \leq An/Bn \leq 1$ or $0.75 \leq Bn/An \leq 1$.

Further, the sum of the areas of the metal wiring patterns 136a in the first region A1 in the layers from the first layer to the N-th layer and the sum of the areas of the metal wiring patterns 136b in the second region B1 in the layers from the first layer to the N-th layer are desirably equal to each other. Further, the amount of the metal wiring patterns 136a in the first region A1 in the layers from the first layer to the N-th layer and the amount of the metal wiring patterns 136b in the second region B1 in the layers from the first layer to the N-th layer are desirably equal to each other.

Further, when the substrate applied to the LED head described in the first or second embodiment is an N-layer substrate including even-number layers in the layers from a first layer to an N-th layer (N is an even number equal to or greater than 2), the substrate applied to the LED head described in the first or second embodiment is desirable to be formed such that the reflectively inverted wiring patterns of the metal wiring patterns in each layer in the layers from the first layer to the N/2-th layer are identical with the metal wiring patterns of the remaining layers (the layers other than the first layer to the N/2-th layer).

With the structure described above, the LED head that includes the substrate including the first layer to the N-th layer (N is an integer equal to or greater than 1) has the same effect as described in the first and second embodiments (including each variant example).

Third Embodiment

Other usage of the LED head (including each variant example) described in the first and second embodiments will be described below.

<Configuration of Image Scanner 3>

Figure 15:
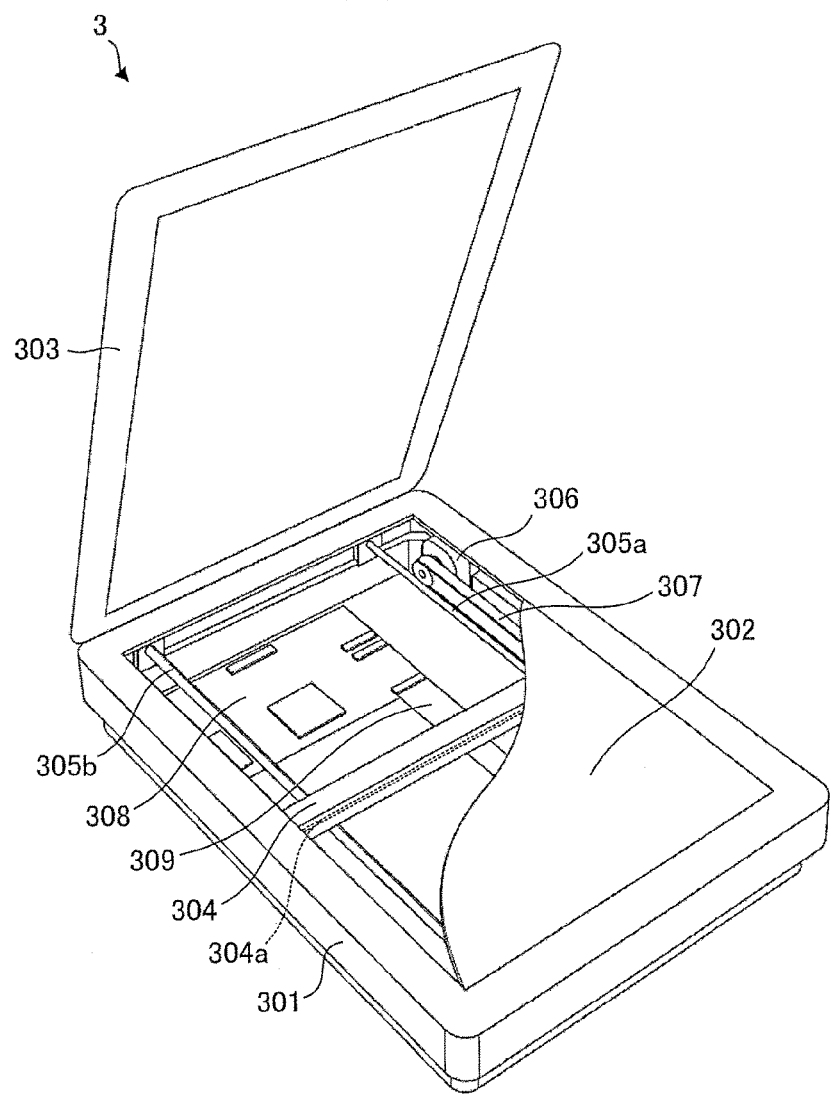
FIG. 15 is a perspective view schematically illustrating an image scanner as an image reading apparatus according to a third embodiment of the present invention.

FIG. 15 is a perspective view schematically illustrating an image scanner 3 as an image reading apparatus according to a third embodiment of the present invention.

As illustrated in FIG. 15, the image scanner 3 as the image reading apparatus includes a housing 301, a document table 302 for putting a document, and a cover 303 (a document table cover) for covering the document put on the document table 302 from above. A contact image sensor head 304 as a light reception device, guides 305a, 305b, a stepping motor 306, a drive belt 307, a control circuit 308, and a flexible flat cable 309 are disposed inside the housing 301.

The contact image sensor head 304 includes a light source (for example, a light emitting diode as a light emitting element) that radiates light, and a substrate 304a. One of the substrates described in the first and second embodiments (including each variant example of the first and second embodiments) is employed as the substrate 304a. Light reception elements (for example, photo diodes) as semiconductor elements for detecting light are fixed on this substrate 304a, in place of the light emitting elements (for example, the light emitting elements 132 described in the first and second embodiments). The light reception elements detect reflected light from a medium put on the document table 302. That is, the light source of the contact image sensor head 304 radiates light, and the light reception elements of the contact image sensor head 304 detect the reflected light from the medium put on the document table 302. The contact image sensor head 304 can read an image of the medium put on the document table 302 on the basis of the detected reflected light.

The contact image sensor head 304 is supported in a straightly movable manner along the paired guides 305a, 305b fixed to the housing 301. In order to slide the contact image sensor head 304 in the sub-scanning direction along the guides 305a, 305b, the contact image sensor head 304 engages with the drive belt 307 engaging with the stepping motor 306. The control circuit 300 for controlling the contact image sensor head 304 is connected to the contact image sensor head 304 via the flexible flat cable 309.

The image scanner 3 according to the third embodiment uses the LED head described in the first and second embodiments (including each variant example), and thus has the same effect as described in the first and second embodiments (including the effect of each variant example) even when the temperature of the substrate 304a rises. Accordingly, the image reading quality of the image scanner 3 according to the third embodiment can be increased.

The feature of each embodiment and the feature of each variant example described above can be combined properly with each other.

DESCRIPTION OF REFERENCE CHARACTERS 1 image forming apparatus, 3 image scanner, 13, 13Bk, 13Y, 13M, 13C LED head, 131, 131a, 131b, 131c, 231, 231a, 304a substrate, 132 light emitting element, 133 converging lens, 134 support member, 134a contact surface, 135 base material, 135a wiring pattern formation surface, 136, 136a, 136b metal wiring pattern, 137 cover member, 138 base member, 304 contact image sensor head.

What is claimed is:

1. A light exposure device comprising:
    a substrate being longer in a first direction and including a base material having one or more wiring pattern formation surfaces and one or more metal wiring patterns formed on the one or more wiring pattern formation surfaces; and
    a plurality of light emitting elements fixed on the substrate,
    wherein the substrate is divided into two regions by a boundary line which is a center line of the wiring pattern formation surface in a second direction orthogonal to the first direction,
    one region of the two regions is a first region,
    the other region of the two regions is a second region, and
    the light exposure device satisfies $0.75 \leq A/B \leq 1$ or $0.75 \leq B/A \leq 1$,
    where
    A is a ratio of a sum of one or more areas of the one or more metal wiring patterns in the first region to a sum of one or more areas of the one or more wiring pattern formation surfaces in the first region, and
    B is a ratio of a sum of one or more areas of the one or more metal wiring patterns in the second region to a sum of one or more areas of the one or more wiring pattern formation surfaces in the second region.

2. The light exposure device according to claim 1, wherein
    the substrate is an N-layer substrate including a plurality of layers from a first layer to an N-th layer (N is an integer equal to or greater than 1), and
    the light exposure device satisfies $0.75 \leq An/Bn \leq 1$ or $0.75 \leq Bn/An \leq 1$,
    where
    An is a ratio of a sum of the one or more areas of the one or more metal wiring patterns in the first region to a sum of the one or more areas of the one or more wiring pattern formation surfaces in the first region, in the layers from the first layer to the N-th layer, and
    Bn is a ratio of a sum of the one or more areas of the one or more metal wiring patterns in the second region to a sum of the one or more areas of the one or more wiring pattern formation surfaces in the second region, in the layers from the first layer to the N-th layer.

3. The light exposure device according to claim 2, wherein the light exposure device satisfies $0.75 \leq Aa/Bb \leq 1$ or $0.75 \leq Bb/Aa \leq 1$,
    where
    Aa is a ratio of a sum of the one or more areas of the one or more metal wiring patterns in the first region to a sum of the one or more areas of the one or more wiring pattern formation surfaces in the first region, in the first layer, and
    Bb is a ratio of a sum of the one or more areas of the one or more metal wiring patterns in the second region to a sum of the one or more areas of the one or more wiring pattern formation surfaces in the second region, in a second layer.

4. The light exposure device according to claim 2, wherein the light exposure device satisfies $0.75 \leq Ab/Ba \leq 1$ or $0.75 \leq Ba/Ab \leq 1$,
    where
    Ba is a ratio of a sum of the one or more areas of the one or more metal wiring patterns in the second region to a sum of the one or more areas of the one or more wiring pattern formation surfaces in the second region, in the first layer, and
    Ab is a ratio of a sum of the one or more areas of the one or more metal wiring patterns in the first region to a sum of the one or more areas of the one or more wiring pattern formation surfaces in the first region, in a second layer.

5. The light exposure device according to claim 2, wherein in the N-layer substrate, reflectively inverted wiring patterns of the metal wiring patterns in the layers from the first layer to an N/2-th layer are identical with the metal wiring patterns of remaining layers.

6. The light exposure device according to claim 2, wherein the sum of the one or more areas of the one or more metal wiring patterns in the first region in the layers from the first layer to the N-th layer and the sum of the one or more areas of the one or more metal wiring patterns in the second region in the layers from the first layer to the N-th layer are equal to each other.

7. The light exposure device according to claim 2, wherein an amount of the one or more metal wiring patterns in the first region in the layers from the first layer to the N-th layer and an amount of the one or more metal wiring patterns in the second region in the layers from the first layer to the N-th layer are equal to each other.

8. The light exposure device according to claim 1, wherein the one or more metal wiring patterns are formed continuously in the first direction, in at least one of the first region and the second region.

9. The light exposure device according to claim 1, wherein the one or more metal wiring patterns are formed intermittently in the first direction, in at least one of the first region and the second region.

10. The light exposure device according to claim 1, wherein the one or more metal wiring patterns include at least one of gold, silver, copper, aluminum, nickel, and palladium.

11. The light exposure device according to claim 1, further comprising a converging lens configured to converge light radiated from the light emitting elements.

12. The light exposure device according to claim 11, further comprising a support member configured to support the substrate and the converging lens.

13. An image forming apparatus comprising the light exposure device according to claim 1.

14. A light reception device comprising light reception elements in place of the light emitting elements according to claim 1.

15. An image reading apparatus comprising the light reception device according to claim 14.

* * * * *